(12) United States Patent
Delagnes

(10) Patent No.: US 7,884,748 B2
(45) Date of Patent: Feb. 8, 2011

(54) RAMP-BASED ANALOG TO DIGITAL CONVERTERS

(75) Inventor: Eric Delagnes, Chaville (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/446,977

(22) PCT Filed: Oct. 25, 2006

(86) PCT No.: PCT/IB2006/003990

§ 371 (c)(1),
(2), (4) Date: Sep. 15, 2009

(87) PCT Pub. No.: WO2008/050177

PCT Pub. Date: May 2, 2008

(65) Prior Publication Data

US 2010/0026545 A1    Feb. 4, 2010

(51) Int. Cl.
   *H03M 1/12*    (2006.01)
(52) U.S. Cl. ..................... 341/156; 375/331
(58) Field of Classification Search ......... 341/155–165; 375/331
   See application file for complete search history.

(56) References Cited

U.S. PATENT DOCUMENTS 4,982,350 A    1/1991  Perna et al.
5,173,698 A    12/1992 Gulczynski
5,877,641 A *  3/1999  Ziegler et al. ............... 327/156
6,346,907 B1   2/2002  Dacy et al.
7,323,918 B1*  1/2008  Tai ............................ 327/158
7,733,149 B2*  6/2010  Delage et al. ............... 327/270

FOREIGN PATENT DOCUMENTS

EP    0 529 875 A2    3/1993

* cited by examiner

*Primary Examiner*—Lam T Mai
(74) *Attorney, Agent, or Firm*—Blakely, Sokoloff, Taylor & Zafman LLP

(57) ABSTRACT

The invention provides an analog-to-digital converter (ADC) of the single ramp type, comprising a ramp generator (101), a clock (102), a digital counter (103) timed by the clock (102), and at least one channel ($10_1$, ..., $10_i$, ..., $10_n$) for data processing, the or each channel comprising a comparator ($20_1$, ..., $20_i$, ..., $20_n$) having an input connected to the ramp generator (101) and the output of which causes for each conversion cycle the storage of the current counter value as a coarse conversion data. According to the present invention, the or each channel ($10_1$, ..., $10_i$, ..., $10_n$) further comprises a delay-chain time interpolator ($40_1$, ..., $40_i$, ..., $40_n$, $50_1$, ..., $50_i$, ..., $50_n$) responsive to the output of the comparator and to the clock (102), for interpolating time within a clock period from the triggering time of the comparator, said interpolator delivering a time-interpolation output signal as a fine conversion data which is combined to the coarse conversion data for each conversion cycle. Application to an increased resolution without excess power consumption or increased conversion period.

18 Claims, 3 Drawing Sheets

RAMP-BASED ANALOG TO DIGITAL CONVERTERS

This is a non-provisional application claiming the benefit of International application number PCT/IB2006/003990 filed Oct. 25, 2006.

The invention relates to Analog to Digital Converters (ADC) and in particular to ADCs of the single ramp type. More precisely the invention relates to multi-channel integrated ADCs of ramp type.

The present invention applies in particular to the field of nuclear science detectors, but may be applied to any field where there is a demand for fast and accurate AD conversion.

The skilled person is familiar with many devices implementing an ADC of the single ramp type.

In this type of architecture, the analog-to-digital conversion is performed by measuring the elapsed time between the start of a voltage ramp, generated by a ramp generator, and the value of the voltage to be converted. The ramp, whether linear or not, can be generated by well known ramp generators.

Conventionally, this elapsed time is measured by a digital counter started synchronously to the start of the voltage ramp. For multi-channels applications, the digital counter and the ramp generator can be shared between the channels so that the ADC part replicated in each channel can be reduced to a comparator, comparing the ramp signal with the input of the channel, and a latch used to copy and memorize the digital counter state when the comparator triggers.

This architecture presents many advantages. Indeed, the power consumption and the area used can be very small even for high dynamic range. The linearity, mainly dominated by that one of the ramp generator, can easily be very good.

Anyway, this architecture is limited by its long conversion time, which increases with the number of bits of the digital data delivered by the ADC, i.e. with its dynamic range and resolution.

For a N bit analog-to-digital conversion, this architecture requires a conversion time $t_{conv}$ equal to $2^N/F_c$, where $F_c$ is the clock period of the digital counter. For example, it means that for a 12-bit conversion, making use of a 100 MHz clock (which appears to be a maximum for reasonable power consumption), a conversion time of 40 µs is required. It appears to be prohibitive for a lot of applications, and especially for some nuclear science applications.

One object of the invention is to overcome this drawback, which limits the performance of ADCs of single ramp type.

This object is achieved, according to a first aspect of the present invention, by an analog-to-digital converter (ADC) of the single ramp type, comprising a ramp generator, a clock, a digital counter timed by the clock, and at least one channel for data processing, the or each channel comprising a comparator having an input connected to the ramp generator and the output of which causes for each conversion cycle the storage of the current counter value as a coarse conversion data, characterized in that the or each channel further comprises a delay-chain time interpolator responsive to the output of the comparator and to the clock, for interpolating time within a clock period from the triggering time of the comparator, said interpolator delivering a time-interpolation output signal as a fine conversion data which is combined to the coarse conversion data for each conversion cycle.

Preferred but non-limiting aspects of this converter are as follows:

said interpolator operates in response to said clock via a synchronizer timed by said clock and having an input connected to the comparator and an output connected to said interpolator, for interpolating time within a clock period between the triggering time of the comparator and a re-synchronized time provided by said synchronizer. Advantageously, said delay-chain interpolator operates without slowing down the ramp generator's rate.

said delay-chain time interpolator operates within a conversion cycle.

said interpolator operates in response to said clock via a synchronizer timed by said clock and having an input connected to the comparator and an output connected to said interpolator, for interpolating time within a clock period between the triggering time of the comparator and a re-synchronized time provided by said synchronizer said interpolator comprises a delay line loop connected to the output of the comparator and including a plurality of digital delay cells.

said delay line loop is servo-controlled such that the delay in each delay cell is equal to an integer fraction of a clock period.

said interpolator comprises a digital memory and an encoder connected to said synchronizer and to said delay line loop for storing the interpolation result.

said memory comprises a plurality of memory cells each connected to a respective digital delay cell.

the digital counter is a Gray-type counter.

the or each comparator comprises a plurality of serially-arranged gain stages followed by a digital level restoring stage.

said comparator comprises a controller for controlling the common mode voltages and output impedance of at least one gain stage.

said at least one gain stage comprises a circuit for limiting the output swing thereof.

the ADC further comprises a processing circuit for combining the coarse conversion data and the fine conversion data into a single digital data.

said processing circuit is a concatenation circuit.

According to a another aspect, the present provides a method for analog-to-digital (AD) conversion of an analog input signal, characterized in that it comprises the following steps performing a ramp-based AD conversion of said input signal by means of a circuit comprising a ramp generator, a digital counter timed by a clock and a comparator, so as to generate from said counter a coarse conversion data when said comparator triggers in response to a ramp generated by said ramp generator crossing said input signal, performing a delay-chain time interpolation in response to said trigger by the comparator, for interpolating time within a period of said clock period from the triggering time, so as to generate a fine conversion data, and combining said coarse conversion data and fine conversion data into a digital output value.

Other features, objects and advantages of the present invention will become apparent from reading the detailed description that follows, and in light of the appended drawings, given by way of non-limiting examples, and in which:

FIG. 1 is a diagrammatic view of a device according to the invention;

FIG. 2*a* shows a close-up on a delay line loop (DLL) of a channel of the device of FIG. 1;

FIG. 2*b* shows an example of a servo-control circuit for said DLL

Figure 1:
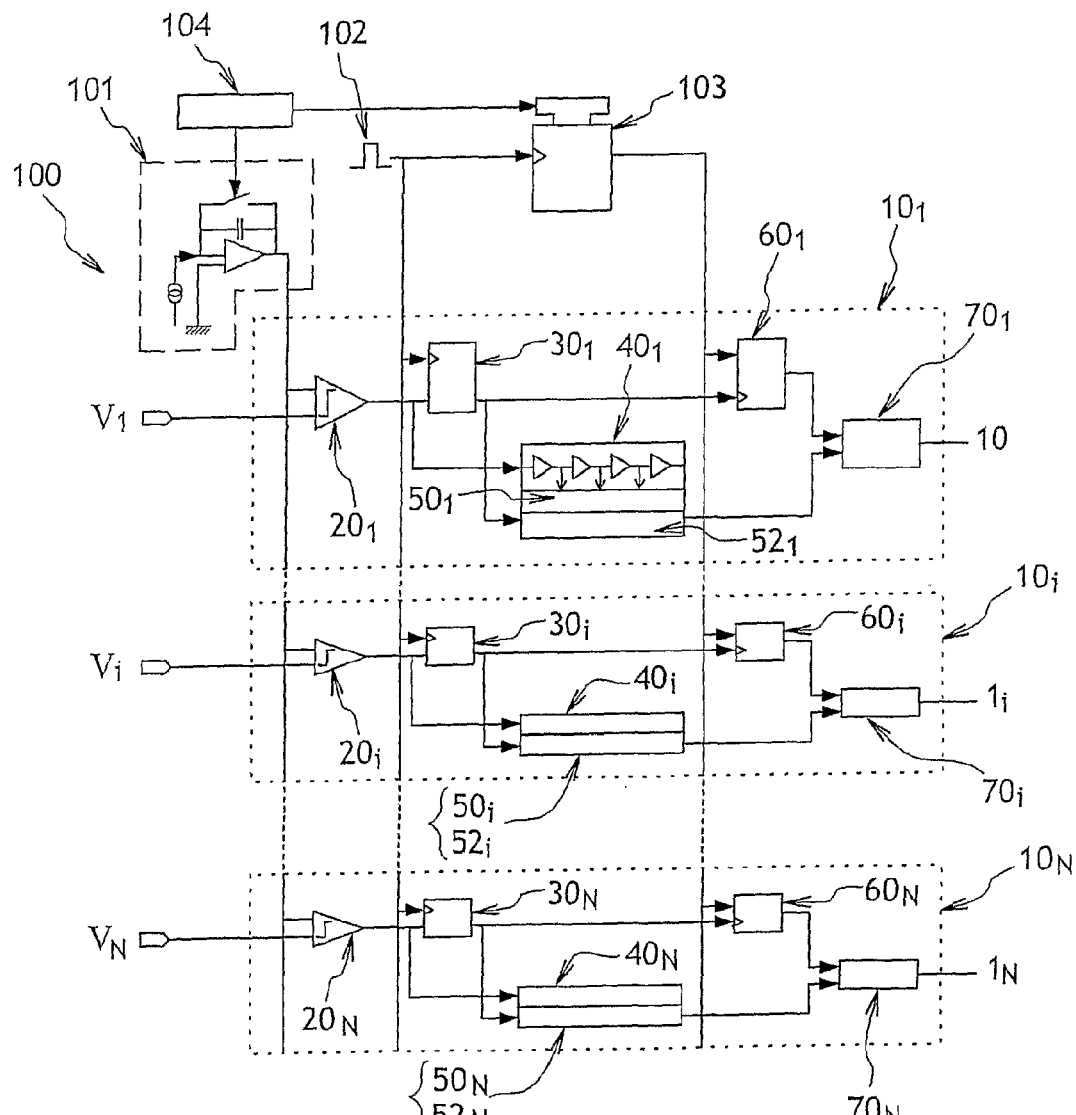

Turning now to the drawings, FIG. 1 shows an analog-to-digital converter 100 (ADC) of the single ramp type. The converter 100 comprises a ramp generator 101, a clock (not shown) generating a clock signal 102, a digital counter 103 timed by the clock signal 102, a conversion sequencer 104 and at least one channel $10_1, \ldots, 10_i, \ldots, 10_n$ for data processing.

The ramp generator 101, the clock signal 102, the digital counter 103 and the conversion sequencer 104 are common to the whole channels when several channels are considered.

The or each channel $10_1, \ldots, 10_i, \ldots, 10_n$ for data processing comprises a comparator $20_1, \ldots, 20_i, \ldots, 20_n$ respectively, a first input of which is connected to the output of the ramp generator 101, and a second input of which receives each of the analog signals to be converted.

In such known ramp-based converter, the resolution of the conversion directly depends from the period value of the clock signal 102 (or its frequency $F_c$) and the slope of the ramp. However, increasing the resolution by increasing the clock frequency $F_c$ is most often not desirable or not technically possible, in particular due to the fact that a significant increase in electrical power consumption would occur. Increasing the resolution by decreasing the ramp slope would not be desirable either, because the conversion rate would be correspondingly decreased.

In order to increase the resolution of such converter without incurring such difficulties, and in particular without substantially increasing the power consumption and without sacrificing the conversion rate, the converter of the present invention includes a delay-based time interpolator for time interpolation within a clock period $T_c=1/F_c$ of the clock signal 102.

More particularly, the output of each comparator $20_1, \ldots, 20_i, \ldots, 20_n$ is connected to an input I1$i$ of a delay line loop (DLL) $40_1, \ldots, 40_i, \ldots, 40_n$.

Figure 2A:
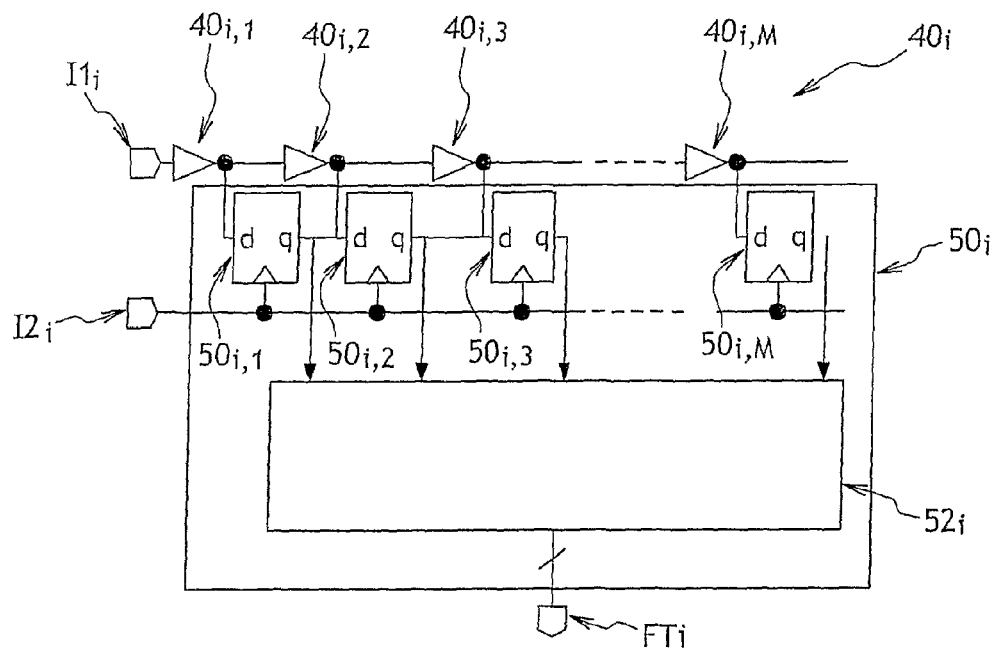
Figure 2B:
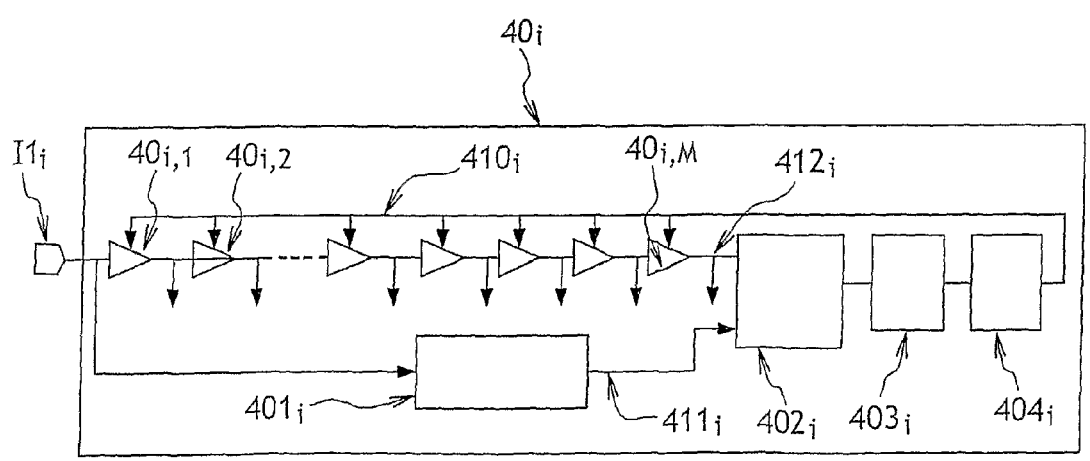

As shown in FIG. 2$a$ for the DLL 40$i$, the or each delay line loop (DLL), comprises a plurality of m elementary digital delay cells $40_{i,1}, 40_{i,2}, 40_{i,3}, \ldots 40_{i,m}$ for i from 1 to n respectively, where n is the number of channels. Each delay cell is preferably made of a combination of two or more starved inverters, in a manner known per se.

For the—or each—channel, the m delay means are serialized and their values are servo-controlled by a feedback loop as shown in FIG. 2$b$.

When several channels are considered, each DLL of a channel is independent in particular, with respect to its feedback loop. However, in a variant embodiment, a master DLL with several slave DLLs could also be employed.

When a comparator $20_1, \ldots, 20_i, \ldots, 20_n$ triggers, i.e. when the voltage ramp has achieved a predetermined V value which corresponds to the instant value of the analog signal $V_i$ to be converted, a signal is applied to the corresponding DLL $40_1, \ldots, 40_i, \ldots, 40_n$. The triggering time $t_{i1}$ of the comparator $20_i$ corresponds to the actual digitalization time of the ADC for the channel $10_i$, and is accordingly the time which is to be known with a better resolution.

In the present case, the total delay of the DLL is equal to $T_c=1/F_c$ so that the delay of each of the m elementary delay cell $40_{i,1}, 40_{i,2}, 40_{i,3}, \ldots 40_{i,m}$ is equal to $1/(F_c*m)$. Thus, when the signal emitted by the comparator $20_1, \ldots, 20_i, \ldots, 20_n$ propagates into the DLL $40_1, \ldots, 40_i, \ldots, 40_n$, each delay cell delays the signal from the time $\Delta t=1/(F_c*m)$.

Each channel further comprises a synchronizer $30_1, \ldots, 30_i, \ldots, 30_n$, a digital memory $50_1, \ldots, 50_i, \ldots, 50_n$ and an encoder 521 in order to encode and store the result of the interpolation, i.e. the state of the DLL $40_1, \ldots, 40_i, \ldots, 40_n$.

The signal applied by a comparator $20_1, \ldots, 20_i, \ldots, 20_n$ to the respective synchronizer $30_1, \ldots, 30_i, \ldots, 30_n$ is re-synchronized with the clock signal 102 by the latter. For this purpose, the synchronizer $30_1, \ldots, 30_i, \ldots, 30_n$ is connected to the clock signal 102. This re-synchronized time $t_{i1}$ differs from the triggering time $t_{i1}$ of the comparator $20_1, \ldots, 20_i, \ldots, 20_n$.

Further, the output of each synchronizer $30_1, \ldots, 30_i, \ldots, 30_n$ is connected to an input I2$i$ of the respective digital memory $50_1, \ldots, 50_i, \ldots, 50_n$. Each digital memory $50_1, \ldots, 50_i, \ldots, 50_n$ further has inputs connected to the m outputs of the m delay cells of the respective DLL.

Each digital memory $50_1, \ldots, 50_i, \ldots, 50_n$ comprises a plurality of m latches $50_{i,1}, 50_{i,2}, 50_{i,3}, \ldots, 50_{i,m}$, for i from 1 to N, each latch being connected to an elementary delay cell $40_{i,1}, 40_{i,2}, 40_{i,3}, \ldots, 40_{i,m}$, respectively.

This circuit thus compares the signal outputted by a comparator $20_1, \ldots, 20_i, \ldots, 20_n$ and going through the series of respective elementary delay cells with the re-synchronized signal emitted by the respective comparator $20_1, \ldots, 20_i, \ldots, 20_n$; the state of the DLL is stored by the latches which each provide a binary information (state "1" or "0") whether one of the time values ($t_{i1}-m*\Delta t$) given by the signal from the comparator is above or below the time value ($t_{i2}$) given by the re-synchronized signal.

For each channel, the fine time value (FTi) is finally obtained by encoding the outputs $50_{i,1}, 50_{i,2}, 50_{i,3}, \ldots, 50_{i,m}$ by encoder $52_I$. This value is coded on I bits, I being at least equal to log(m)/log(2) bits.

Accordingly, the circuit allows to know the actual digitalization time with an accuracy of $\Delta t=1/(F_c*m)$, where $F_c$ is the frequency of the clock and m the number of elementary delay cells of the DLL.

Various types of memory elements $50_{i,1}, 50_{i,2}, 50_{i,3}, \ldots, 50_{i,m}$, can be used, such as D flip-flops or RS latches.

The above-described architecture, compared to an architecture which would use a continuously running DLL $40_1, \ldots, 40_i, \ldots, 40_n$ fed by the clock signal 102 and stopped when the comparator $20_1, \ldots, 20_i, \ldots, 20_n$ triggers, allows to reduce power consumption, although it normally requires a specific calibration phase.

The calibration can be performed before or after the conversion, using circuits for servo-controlling the total delay of the delay line, and therefore each of the elementary delay cells. For example and with reference to FIG. 2$b$, the calibration can be achieved by the following succession of steps:

sending a calibration pulse synchronous with the clock signal 102 to the input I1$i$ of the DLL.

then comparing the phase by the phase comparator 402$i$ of the DLL output 412$i$ with those (411$i$) of the calibration pulse delayed by one or several clock periods of signal 102 in the 401$i$ block.

and then controlling the command voltage 410$i$ of the delays of the DLL using a signal generated by a charge pump 403$i$ optionally filtered by a filter 404$i$ driven by the output of the phase comparator 402$i$.

Accordingly, the power consumption of the DLL is quite low as it is operational only during time interpolation and during the calibration phase.

It will be understood that the fine resolution (R) of the conversion based on the digitalization time depends on the frequency of the clock signal 102 and on the number m of elementary delay cells, this accuracy being defined as R=1/($F_c$*m).

Turning again to the circuit architecture, each channel further comprises a memory $60_1, \ldots, 60_i, \ldots, 60_n$ for storing the count value delivered by counter 103 at the time the ramp crosses the analog signal value to be converted. Each memory is controlled by the output of the respective synchronizer $30_1, \ldots, 30_i, \ldots, 30_n$. The coarse conversion data (ramp conversion) stored in each memory $60_1, \ldots, 60_i, \ldots, 60_n$ and the fine conversion data (state of the DLL) provided by memory cells $50_1, \ldots, 50_i, \ldots, 50_n$ and encoder 52 can be combined in a respective processing unit $70_1, \ldots, 70_i, \ldots, 70_n$ to obtain, at the respective output $10, \ldots, 1i, \ldots, 1n$, the complete conversion result for the respective channel.

In a basic embodiment, such combination is a concatenation of the binary data from $50_1, \ldots, 50_i, \ldots, 50_n$ and $60_1, \ldots, 60_i, \ldots, 60_n$ respectively.

However, various other combinations may be contemplated, such as a linear combination of the digital values, provided that the corresponding computation does not significantly delay the conversion process.

The conversion sequencer 104 controls the timing of a digital conversion sequence, as detailed above. For this purpose, the conversion sequencer delivers timed signals for resetting of the ramp generator 101 and the digital counter 103 at the beginning or each new sequence.

The description which follows focuses on the other aspects involved in implementing the present the invention, and the related advantages.

First ai the ramp generator 101 should generate a ramp which is as linear as possible and as reproducible as possible.

For this purpose, the ramp generator 101 is preferably formed of a stabilized current source, in particular a temperature-compensated current source, and of an integrator. The stabilized current source comprises a current source with an operational amplifier and a mirror transistor connected to the operational amplifier output. The mirror transistor is connected to the integrator via a switch device. Such ramp generator is well-known in the art and will not be further described.

It is understood that other types of ramp generators achieving sufficient performance, also known in the art, could be used. In this regard, non linear ramps (e.g. log ramps, . . . ) can also be used.

The ramp generator 101 should be as far as possible noise-free, as the performance of such an ADC is mostly affected by the noise present in the ramp signal.

As known in the art, the noise generated by a ramp generator increases with the time elapsed from the beginning of the ramp. For that reason, the architecture of the invention is advantageous because the conversion time is kept low while increasing the resolution. For instance, if m=32 (i.e. a five bit increase in resolution), then the noise generated by the ramp generator 101 can be reduced by a factor comprised between 5 and 6 compared to a ramp-only converter having the same resolution.

The digital counter 103 is preferably a Gray type counter. This allows to reduce noise and power consumption of the ADC because there are less commutations on the bus connecting the digital counter 103 and the memories $60_1, \ldots, 60_i, \ldots, 60_n$. This advantage is of course particularly sharp for a multi-channel ADC.

However, the invention is not limited to a counter of Gray type, and the use of any well-known digital counter is still within the scope of the invention.

The requirements for the comparators $20_1, \ldots, 20_i, \ldots, 20_n$ are particularly stringent:
- their power consumption must remain as low as possible,
- their delay must not depend on the input level for linearity reasons (stability with the input level),
- this delay must be stable with temperature.

For a unique channel application, the comparator $20_1$ can be a comparator with a very high reaction time, as known in the art.

Anyway, in the case of a multi-channel application, such a solution may be difficult to implement for power consumption reasons.

In such case (but also when only one channel is considered), it is possible to implement a comparator $20_1, \ldots, 20_i, \ldots, 20_n$ with a moderate reaction time, typically equal to about one or two periods of the clock signal 102, so as to obtain a good compromise between rapidity and power consumption.

Figure 3:
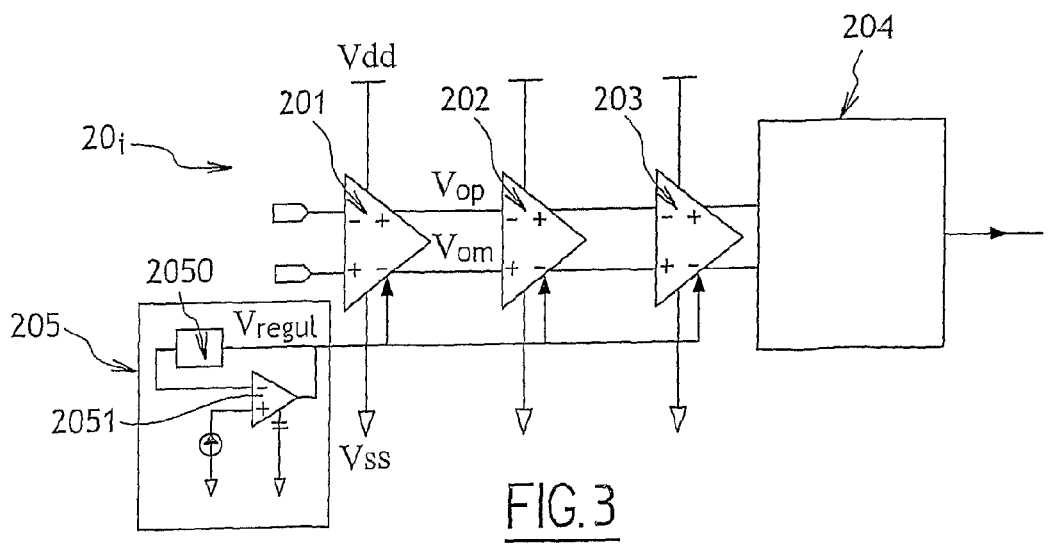
FIG. 3 is a diagrammatic view of a comparator used in the device of FIG. 1.
Figure 4:
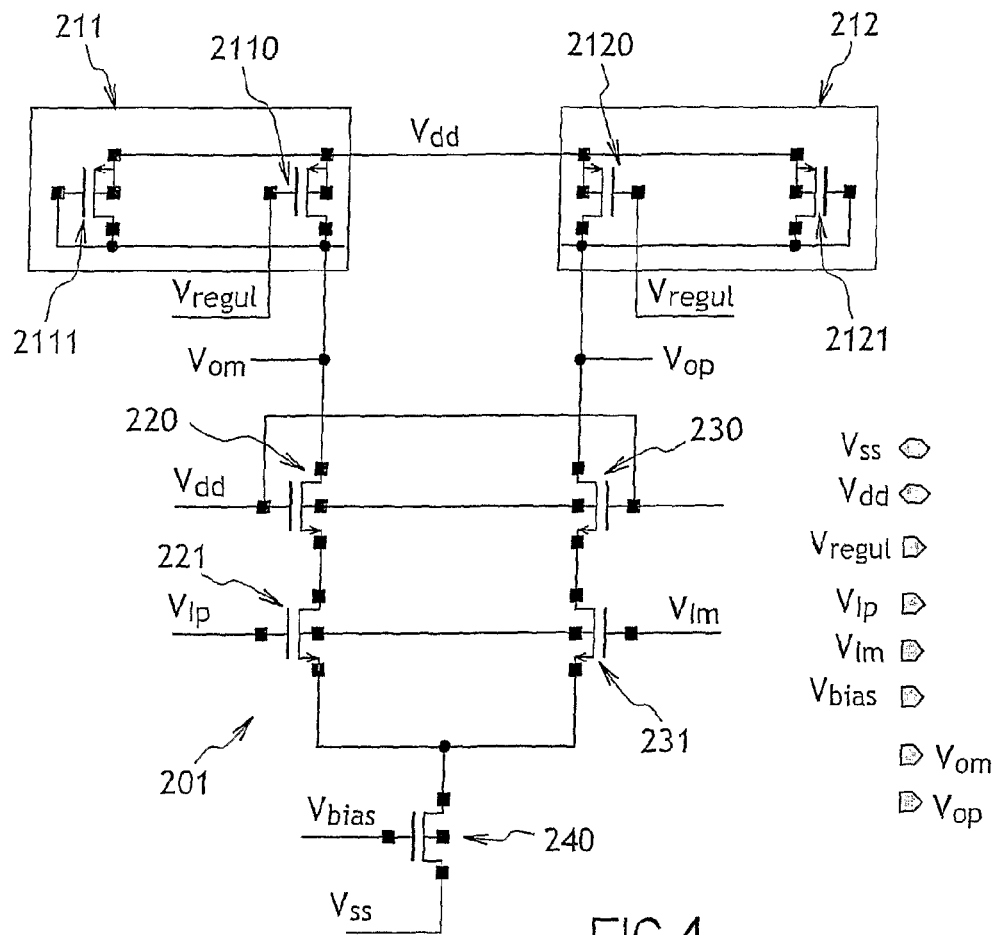
FIG. 4 is a diagrammatic view of a gain stage of a comparator of the device of FIG. 1.
Figure 5:
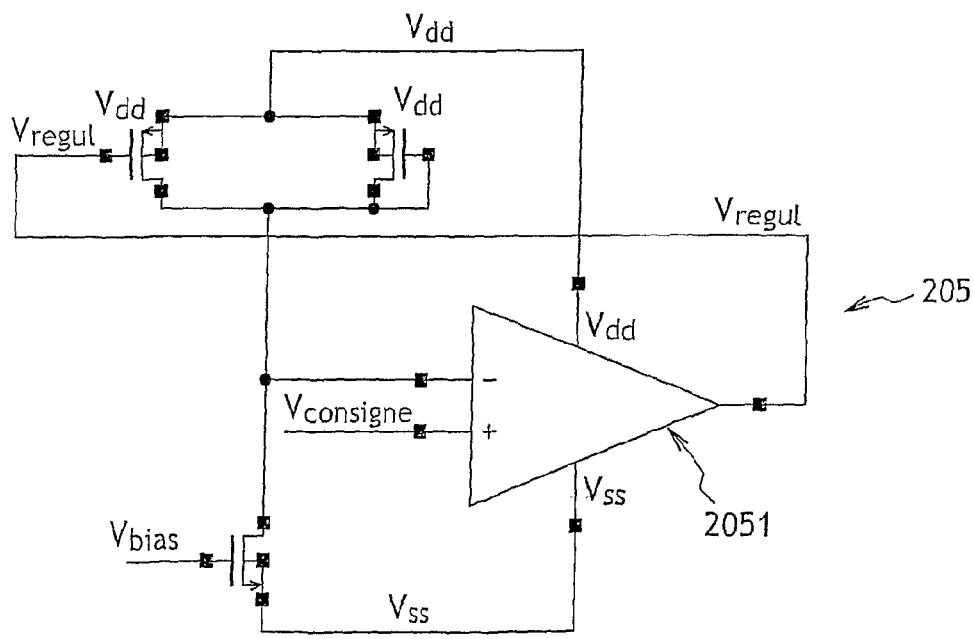
FIG. 5 illustrates a control stage of the gain stages of a comparator of the device of FIG. 1.

As shown in FIGS. 3-5, such a comparator has a four-stage architecture, with three gain stages 201, 202, 203 having the same structure followed by a fourth stage 204 acting as a digital level restoring circuit for providing binary information from the analog input. This architecture which is represented for example for the $i^{th}$ channel in FIG. 3.

The stability of the reaction time with the input level is achieved, for each of the gain stages, by:
- transistors 221, 231, 240 which combine a differential pair with a current source, together with a so-called "cascode pair" made by transistors 220, 230 so as to increase the gain/bandwidth product of the considered stage,
- a controller 205 comprising an operational amplifier 2051 and a feedback loop 2050 for controlling the common mode voltages $V_{Om}$ et $V_{Op}$ at the output of each gain stage 201, 202, 203 (FIGS. 3 and 5),
- combinations of transistors 2110 and 2120 2121 having $V_{dd}$ and $V_{regul}$ as inputs and behaving like tunable resistors for small signals and transistors 2111 and 2121 playing the role of peak-limiting diodes, for controlling the output swing of the gain stage (voltage at the outputs $V_{Om}$ et $V_{Op}$).

The voltage source 240 is preferably temperature-compensated so that for each gain stage, the slew-rate at the outputs $V_{Om}$ et $V_{Op}$, and the gain-bandwidth product are stabilized.

The load resistance of each gain stage is also controlled by the $V_{regul}$ voltage common to all the comparators, so that the quiescent point of the outputs $V_{Om}$ and $V_{Op}$ remains constant. This voltage is generated by a reference source as the one of FIG. 5. This source generates $V_{regul}$ in order that the quiescent point of $V_{Om}$ and $V_{Op}$ is equal to $v_{consigne}$.

This implies that the slope of the output signals in the neighborhood of the quiescent point does not depend on the temperature.

The logic level restoring stage 204 can be of any conventional design and does not imply any difficulties of implementation.

It should be noted here that the comparator architecture as described above with reference to FIGS. 3-5 is seen as a novel architecture per se which may find interest in many applications other than a ramp-based ADC, where similar performances are desirable.

The synchronizer $30_1, \ldots, 30_i, \ldots, 30_n$ can be a conventional circuit. A further advantage thereof is that it decreases the probability of metastability of the device which might arise from the asynchronous character of the signals outputted by the comparators.

All others parts of the invention which are not described above, such as the memory $60_1, \ldots, 60_i, \ldots, 60_n$ or the processing means $70_1, \ldots, 70_i, \ldots, 70_n$ are well-known in the art and do not imply any difficulty of implementation.

The present invention is not limited to the embodiments described in the foregoing, but the skilled person can devise many modifications and changes.

The present invention may be applied to both single-channel and multi-channel converters.

The invention claimed is:

1. An analog-to-digital converter (ADC) of the single ramp type, comprising a ramp generator (101), a clock (102), a digital counter (103) timed by the clock (102), and at least one channel ($10_1, \ldots, 10_i, \ldots, 10_n$) for data processing, the or each channel comprising a comparator ($20_1, \ldots, 20_i, \ldots, 20_n$) having an input connected to the ramp generator (101) and the output of which causes for each conversion cycle the storage of the current counter value as a coarse conversion data, characterized in that the or each channel ($10_1, \ldots, 10_i, \ldots, 10_n$) further comprises a delay-chain time interpolator ($40_1, \ldots, 40_i, \ldots, 40_n, 50_1, \ldots, 50_i, \ldots, 50_n$) responsive to the output of the comparator and to the clock (102), for interpolating time within a clock period ($T_c$) from the triggering time ($t_{i1}$) of the comparator ($20_i$), said interpolator delivering a time-interpolation output signal as a fine conversion data which is combined to the coarse conversion data for each conversion cycle.

2. An ADC according to claim 1, characterized in that said interpolator ($40_1, \ldots, 40_i, \ldots, 40_n, 50_1, \ldots, 50_i, \ldots, 50_n$) operates in response to said clock via a synchronizer ($30_1, \ldots, 30_i, \ldots, 30_n$) timed by said clock and having an input connected to the comparator and an output connected to said interpolator, for interpolating time within a clock period ($T_c$) between the triggering time ($t_{i1}$) of the comparator and a re-synchronized time ($t_{i2}$) provided by said synchronizer.

3. An ADC according to claim 1 or 2, characterized in that said delay-chain time interpolator operates within a conversion cycle.

4. An ADC according to claim 1, characterized in that said interpolator comprises a delay line loop ($40_1, \ldots, 40_i, \ldots, 40_n$) connected to the output of the comparator and including a plurality of digital delay cells.

5. An ADC according to claim 4, characterized in that said delay line loop is servo-controlled such that the delay in each delay cell is equal to an integer fraction of a clock period.

6. An ADC according to claim 1, characterized in that said interpolator comprises a digital memory ($50_1, \ldots, 50_i, \ldots, 50_n$) and an encoder (52) connected to said synchronizer ($30_1, \ldots, 30_i, \ldots, 30_n$) and to said delay line loop ($40_1, \ldots, 40_i, \ldots, 40_n$) for storing the interpolation result.

7. An ADC according to claim 6, characterized in that said memory comprises a plurality of memory cells ($50_{i,1}, 50_{i,2}, 50_{i,3}, \ldots, 50_{i,m}$) each connected to a respective digital delay cell.

8. An ADC according to any one of claims 1, characterized in that the digital counter (103) is a Gray-type counter.

9. An ADC according to any one of claims 1, characterized in that the or each comparator ($20_1, \ldots, 20_i, \ldots, 20_n$) comprises a plurality of serially-arranged gain stages (201, 202, 203) followed by a digital level restoring stage (204).

10. An ADC according to claim 9, characterized in that said comparator comprises a controller (205) for controlling the common mode voltages ($V_{Om}, V_{Op}$) and output impedance of at least one gain stage (201, 202, 203).

11. An ADC according to claim 9, characterized in that at least one gain stage (201, 202, 203) comprises a circuit (2111, 2121) for limiting the output swing thereof.

12. An ADC according to claim 1, characterized in that it further comprises a processing circuit for combining the coarse conversion data and the fine conversion data into a single digital data.

13. An ADC according to claim 12, characterized in that said processing circuit is a concatenation circuit.

14. A Method for analog-to-digital (AD) conversion of an analog input signal, characterized in that it comprises the following steps performing a ramp-based AD conversion of said input signal by means of a circuit comprising a ramp generator, a digital counter timed by a clock and a comparator, so as to generate from said counter a coarse conversion data when said comparator triggers in response to a ramp generated by said ramp generator crossing said input signal, and performing a delay-chain time interpolation in response to said trigger by the comparator, for interpolating time within a period of said clock period from the triggering time, so as to generate a fine conversion data.

15. A method according to claim 14, characterized in that said interpolation step includes a synchronization sub-step operating in response to said clock and said trigger by the comparator and controlling said interpolation step for interpolating time within a clock period between said triggering time and a re-synchronized time.

16. A method according to claim 14 or 15, characterized in that said delay-chain time interpolation is performed within a conversion cycle.

17. A method according to any one of claims 14, characterized in that it further comprises the step of:
combining said coarse conversion data and fine conversion data into a digital output value.

18. A method according to claim 17, characterized in that said combination step comprises a concatenation.

* * * * *

UNITED STATES PATENT AND TRADEMARK OFFICE
CERTIFICATE OF CORRECTION

| | | |
|---|---|---|
| PATENT NO. | : 7,884,748 B2 | Page 1 of 1 |
| APPLICATION NO. | : 12/446977 | |
| DATED | : February 8, 2011 | |
| INVENTOR(S) | : Eric Delagnes | |

It is certified that error appears in the above-identified patent and that said Letters Patent is hereby corrected as shown below:

Column 8, Claim 8, line 5, delete "any one of claims" insert -- claim --

Column 8, Claim 9, line 7, delete "any one of claims" insert -- claim --

Column 8, Claim 17, line 45, delete "any one of claims" insert -- claim --

Signed and Sealed this
Tenth Day of May, 2011

David J. Kappos
*Director of the United States Patent and Trademark Office*